United States Patent [19]
Phillips et al.

[11] Patent Number: 5,587,880
[45] Date of Patent: Dec. 24, 1996

[54] COMPUTER COOLING SYSTEM OPERABLE UNDER THE FORCE OF GRAVITY IN FIRST ORIENTATION AND AGAINST THE FORCE OF GRAVITY IN SECOND ORIENTATION

[75] Inventors: Richard J. Phillips, Alachua, Fla.; Ralph I. Larson, Bolton, Mass.

[73] Assignee: Aavid Laboratories, Inc., South Lancaster, Mass.

[21] Appl. No.: 495,961

[22] Filed: Jun. 28, 1995

[51] Int. Cl.⁶ .............................. H05K 7/20; F28D 15/02
[52] U.S. Cl. ................... 361/687; 361/700; 165/104.29; 165/104.33; 62/259.2
[58] Field of Search .................................. 361/683, 687, 361/689, 699, 700; 165/46, 104.33, 104.22, 104.23, 104.24, 80.4, 104.29; 174/15.2; 62/259.2

[56] References Cited

U.S. PATENT DOCUMENTS

| | | | |
|---|---|---|---|
| 2,961,476 | 11/1960 | Maslin et al. | 154/15.1 |
| 3,256,703 | 6/1966 | Selwitz | 62/37 |
| 3,332,476 | 7/1967 | McDougal | 165/51 |
| 3,402,761 | 9/1968 | Swet | 165/32 |
| 3,517,730 | 6/1970 | Wyatt | 165/32 |
| 3,604,503 | 9/1971 | Feldman et al. | 165/96 |
| 3,613,773 | 10/1971 | Hall et al. | 165/32 |
| 3,682,237 | 8/1972 | Islo | 165/32 |
| 3,741,292 | 6/1973 | Aakalu et al. | 165/1 |
| 3,863,710 | 2/1975 | Masters | 165/46 |
| 4,057,963 | 11/1977 | Basiulis | 60/641.7 |
| 4,095,090 | 6/1978 | Pianezza | 219/441 |
| 4,212,347 | 7/1980 | Eastman | 165/46 |
| 4,295,342 | 10/1981 | Parro | 62/119 |
| 4,330,033 | 5/1982 | Okada et al. | 165/104.27 |
| 4,333,517 | 6/1982 | Parro | 165/1 |
| 4,787,843 | 11/1988 | Huffman | 432/91 |
| 4,847,731 | 7/1989 | Smolley | 361/700 |
| 4,912,548 | 3/1990 | Shanker et al. | 257/15 |
| 4,951,740 | 8/1990 | Peterson et al. | 165/32 |
| 4,971,138 | 11/1990 | Lowenstein | 165/46 |
| 4,995,451 | 2/1991 | Hamburgen | 228/119 |
| 4,997,032 | 3/1991 | Danielson et al. | 165/46 |
| 4,997,034 | 3/1991 | Steffen et al. | 165/104.34 |
| 5,000,256 | 3/1991 | Tousignant | 165/46 |
| 5,046,552 | 9/1991 | Tousignant | 165/46 |
| 5,168,919 | 12/1992 | Bereholz et al. | 165/80.4 |
| 5,203,399 | 4/1993 | Koizumi | 165/104.33 |
| 5,206,791 | 4/1993 | Novotny | 361/700 |
| 5,249,358 | 10/1993 | Tousignant et al. | 29/890.03 |

FOREIGN PATENT DOCUMENTS

| | | |
|---|---|---|
| 53-145141 | 12/1978 | Japan . |
| 54-14169 | 2/1979 | Japan . |
| 57-66653 | 4/1982 | Japan . |
| 19754 | 1/1989 | Japan . |
| 58119659 | 1/1989 | Japan . |
| 267792 | 3/1990 | Japan . |
| 785461 | 10/1957 | United Kingdom . |

OTHER PUBLICATIONS

*Controlling Pressure Changes in a Liquid Encapsulated Module*, N. G. Aakalu et al., IBM Technical Disclosure Bulletin, vol. 14, Jan. 1972, p. 2533.

Nicholas Baran, Liquid–Cooled PCs: The Next Hot Thing, BYTE, No. 2 Feb. 1994.

*Primary Examiner*—Leo P. Picard
*Assistant Examiner*—Jayprakash N. Gandhi
*Attorney, Agent, or Firm*—Bookstein & Kudirka, P.C.

[57] ABSTRACT

A two-phase liquid cooling system utilizes and evaporator unit for vaporizing a liquid coolant and a condenser unit for condensing the coolant vapor. The unit is capable of operating in at least two orientations: in one orientation, the condenser is located vertically above the evaporator and condensed coolant returns from the condenser to the evaporator under the force of gravity. In another orientation, the evaporator is located vertically above the condenser and the liquid coolant is returned to the evaporator by a stream of bubbles rising in a tube connecting the evaporator and the condenser. The stream of bubbles is produced by a small heater which is operated by a gravity controlled switch. A check valve is provided to insure that the bubble stream moves in the proper direction. The cooling system has at least one wall with sufficient flexibility that the wall expands as the coolant vapor expands thereby maintaining the internal container pressure substantially the same as the ambient environmental pressure.

20 Claims, 10 Drawing Sheets

COMPUTER COOLING SYSTEM OPERABLE UNDER THE FORCE OF GRAVITY IN FIRST ORIENTATION AND AGAINST THE FORCE OF GRAVITY IN SECOND ORIENTATION

FIELD OF THE INVENTION

This invention relates, in general, to cooling apparatus for heat dissipating components including electronic devices, such as discrete electronic components and integrated circuit chips, and, in particular, to a cooling apparatus which utilizes both a liquid phase and a vapor phase of a coolant to provide enhanced heat transfer.

BACKGROUND OF THE INVENTION

Traditional methods of cooling various components, such as electrical components, have often involved air convection cooling. In such cooling, heat dissipated by an electronic component is transferred to the surrounding air which carries the heat to an ultimate sink, generally, the room in which the component is located. The heat transfer process can be enhanced by increasing the surface area of contact between the component and the air, for example by using fins on the component or by mounting the component on a heat sink to which heat is transferred by conduction and which then dissipates heat by convection. The heat sink may itself have fins to promote convection. In addition, convection may occur by natural air circulation or by forcing the air to circulate by means of fans or blowers. Such traditional air convection cooling functions well, but has significant limitations.

For example, as modern day electronic equipment has become more sophisticated and more compact, electronic component density has steadily increased: this trend has been mirrored in integrated circuit packages in which functionality has been increased without a corresponding increase in package size by greatly increasing the number and density of active devices, such as transistors, within the packages.

As the number of active devices has increased within a fixed package volume, heat dissipated by these devices has also increased to the point where, in many modern day devices, the power density is so high that conventional air convection cooling methods, even using forced air circulation, cannot remove the dissipated heat sufficiently fast in order to keep the circuit package within its allowed operating temperature range. Further, forced air convection cooling methods also have practical limits because the high air flow required to provide sufficient cooling in many high-powered systems can create an unacceptable noise level in a relatively quite environment such as an office.

Consequently, several liquid cooling techniques have conventionally been used with high-power electronic components. These techniques generally fall into two broad groups comprising single phase and two phase cooling systems. In a single phase liquid cooling system, the liquid coolant remains as a liquid over the normal operating range of the system. This is in contrast to a two phase cooling system in which the liquid coolant changes from its liquid phase to a vapor phase during at least one point in the normal operating range.

An example of a single phase liquid cooling system which uses natural convection comprises a hermetic enclosure which encloses the heat-generating component device. The enclosure may be provided with external fins and is filled with a conductive liquid coolant. Heat is transferred from the heat dissipating component to the coolant mainly by conduction and from the coolant to the enclosure by natural convection. The enclosure itself may be cooled by circulating air around the outside of the enclosure. Such a cooling method is effective but involves additional problems, such as chemical incompatibilities between the component and the coolant and difficulty of maintaining the component.

Other single phase cooling systems do not immerse the heat-generating component directly in the liquid coolant, but instead confine the coolant in a container. Heat is conducted from the generating component through the container wall into the liquid coolant which then dissipates the heat by natural convection. An example of such a cooling system uses a sealed flexible bag which is filled with a liquid coolant. The bag may be constructed from a flexible plastic film which is relatively impermeable to both air and the liquid coolant. The bag is placed in contact with the heat-dissipating component and, since the bag is flexible, it conforms to the component shape and heat is transferred through the relatively thin plastic film to the coolant. Other embodiments of this type of system use metal inserts to more efficiently conduct the heat from heat-dissipating component to the coolant. Examples of coolant bag systems are shown in U.S. Pat. Nos. 4,997,032 and 5,000,256.

While such single phase systems can be useful in many situations, their heat transfer rate is still relatively low, and, consequently, they cannot be used with a high-power electronic components unless they have a relatively large volume which is incompatible with most compact electronic systems available today.

Single phase forced convection designs have also been used. In these latter designs, the heat-dissipating component is located inside a small enclosure through which liquid coolant is pumped. The coolant is generally recirculated between the component enclosure and a liquid-air heat exchanger (occasionally a liquid-liquid heat exchanger is used) where the heat is dissipated by either natural or forced convection. These latter cooling systems can dissipate large amounts of heat, but are subject to leaks and require pumps for operation.

Consequently, two phase liquid cooling systems have been used to overcome the problems of single phase systems. In a conventional two phase cooling system, a low boiling point liquid coolant is used; the liquid is vaporized or boiled by heat dissipated by the electronic component and the vapor travels to a condenser. In the condenser the coolant vapor is converted back into a liquid and the liquid is then returned to the heat dissipating component so that the boiling/condensing cycle can be repeated.

An example of a two phase device in which the heat dissipating component is directly immersed in the coolant is shown in U.S. Pat. No. 3,741,292. The heat dissipating component is located in a hermetic enclosure which contains a sufficient pool of low boiling point dielectric liquid coolant to partially fill the enclosure and immerse the heat dissipating component. The liquid is evaporated and the heat dissipated by the component and the resulting vapor is collected in the enclosure space located above the liquid pool. This enclosure space can have fins extending inwardly into the enclosure which fins serve as a condenser for the coolant vapor. The enclosure is also equipped with external fins which serve as an air cooled heat sink to cool the enclosure. As the vapor condenses it runs back into the liquid pool under the influence of gravity.

Another type of two phase cooling system which does not directly immerse the component in the coolant is a heat pipe system. A heat pipe consists of an elongated, hermetic container with thermally conductive walls, for example, a copper pipe is often used. One end of the container acts as an evaporator and the other end acts as a condenser. A wick or other capillary device extends along the length of the container - if a copper pipe is used, the wick often consists of a fine mesh screen extending along the inside of the pipe. The container is partially filled with a low boiling point liquid coolant and the residual non-condensing gases are purged. More particularly, during construction of the heat pipe, the air which normally fills the container is purged by boiling the coolant to drive off the air. The container is then sealed.

The evaporator end is mounted next to the heat dissipating component and heat is transferred by conduction through the container wall of the device. As the coolant evaporates or boils, the resulting vapor travels down the container to the condenser end where it condenses back to a liquid. The liquid is returned to the evaporator end by means of the wick (or alternatively by gravity).

The direct immersion enclosure and the heat pipe can transfer heat efficiently away from a heat dissipating component, but also have limitations. More specifically, both the direct immersion enclosure and indirect heat pipe two phase devices utilize rigid, hermetically sealed containers and, thus, the internal pressure of the devices does not remain equal to the ambient environmental pressure. For example, in a heat pipe device, most of the non-condensable residual gas is purged during manufacture to prevent excessive pressures in the device in the normal temperature operating range. Consequently, when the device is not operating, there usually exists a slight vacuum in the device at normal ambient temperature. Accordingly, the device is prone to leaks, and, if a leak occurs, air will be drawn into the device. Later, when the device is operating, the increased pressure produced by the air may drive some of the liquid out of the container. Consequently, the devices are not reliable in an environment where long term maintenance is impossible.

Further, due to the fact that the container walls are rigid, as the liquid coolant vaporizes, the pressure inside the prior art devices increases, in turn, increasing the coolant boiling point. The increase in boiling point is exacerbated by the presence of residual air and air introduced into the system by leaks. Consequently, the coolant liquid within the devices does not have a single boiling point but rather a range of boiling points and the devices do not operate at a single temperature but instead operate over a relatively broad range of temperatures.

Further, such devices are often subject to a phenomenon called "overshoot". Overshoot occurs during device warmup because the liquid coolant does not begin to boil when it reaches its boiling point. Instead, the liquid temperature continues to increase until the temperature is significantly over the normal coolant boiling temperature and boiling suddenly erupts. When boiling finally does occur, the device temperature returns to its normal operating temperature range. Overshoot is highly undesirable as it stresses the components to be cooled and, in some cases, may cause a component to temporarily operate outside its normal operating temperature range.

In addition, two-phase cooling devices which rely solely on gravity to return condensate to an evaporation area suffer from the additional drawback that they can only operate in a limited range of orientations. That is, if the vapor condenses in a region that is "downhill" from the evaporation area, condensate will not return to the evaporation region, phase-change cooling will not take place, and catastrophic device failure may result. Although a wick may be employed to return condensate to the evaporation area, a wick will provide only limited transport capacity. It is also possible to use a pump to provide sufficient condensate-delivery capacity, but only at the price of additional expense and complexity.

Accordingly, it is an object of the present invention to provide a cooling system for electronic components which has a high heat transfer rate and can maintain the electronic component within a relatively narrow temperature range. Additional objects achieved by various embodiments of the invention are to provide cooling systems which do not require maintenance, are reliable over a long time period and which are not subject to overshoot. A further object is to provide a cooling system which can operate even if it is turned "upside-down".

SUMMARY OF THE INVENTION

The foregoing problems are solved and the foregoing objects are achieved in illustrative embodiments of the invention in which a two phase liquid cooling system has a structure in which the internal pressure of the system remains substantially equal to the ambient environmental pressure over the entire thermal operating range. Operation without an internal pressure change is achieved by constructing the system with at least one flexible container wall. The wall has sufficient flexibility that the wall expands as the coolant vapor expands thereby maintaining the internal container pressure substantially the same as the ambient pressure. Consequently, the liquid coolant boils within a single, very narrow temperature range and the inventive device can maintain a heat dissipating device with that range.

In one embodiment of the invention, the cooling system consists of a rigid evaporator unit which is attached to the heat dissipating component and a condenser unit. The evaporator unit and the condenser unit are connected together by rigid or semi-flexible tubes. The condenser is constructed with at least one wall that is sufficiently flexible to maintain the internal pressure of the system substantially at the ambient pressure. In addition, residual, non-condensing gases such as air are not purged from the system, but remain in the system so that when the device is not operating, the internal pressure remains, near to, or substantially at ambient pressure. Thus, the inventive device is not prone to the leaking problem that is found in prior art heat pipes.

In other embodiments of the invention, the overshoot problem of the prior art devices is reduced by allowing residual gases to remain in the cooling system. More particularly, sufficient residual gas is maintained in the system so that some of the gas dissolves in the liquid coolant when the device is not operating and is at ambient temperature. During warmup, the residual gas comes out of solution and creates nucleation sites that initiate boiling and prevent overshoot. Additional nucleation sites can also be added to reduce overshoot by treating the inside surface of the evaporator unit, for example by laser machining, to create nucleation sites.

More particularly, in accordance with another aspect of the invention, the rigid evaporator can be either an integral part of the component package or a separate part which is attached to the component package. The evaporator unit and the condenser unit are interconnected via one or more flexible pipes which can be preferably made o plastic tubing.

In operation, the coolant liquid is evaporated or boiled in the evaporator unit and travels to the condenser unit where the liquid condenses. The condensed liquid is returned to the evaporator unit by gravity.

In a further embodiment which is useful for those component applications where gravity may not return condensate to the evaporator unit (for example, if the cooler is used in a computer that may operate in either one orientation or in a second inverted orientation), the invention employs a heater to create a frothing action which returns condensate to the evaporator unit against the force of gravity and a valve and bypass mechanism to ensure that the coolant vapor and liquid circulate in a direction that ensures proper operation of the cooler.

In accordance with another aspect of the invention, the condenser unit can be made entirely of a polymeric material. For example, the condenser may be entirely constructed of thin, flexible polymeric films or sheets. Alternatively, a portion of the condenser can be constructed of thicker polymeric material by means of injection molding or blow molding and the remaining portions constructed of flexible polymeric material films in order to provide a flexible wall to maintain the internal pressure equivalent to the ambient pressure.

In accordance with another embodiment of the invention, a portion of the condenser can be constructed of sheet, or molded, metal or plastic formed with fins for enhanced heat transfer and a thin polymeric sheet is sealed to the metal condenser portion to provide a flexible wall.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
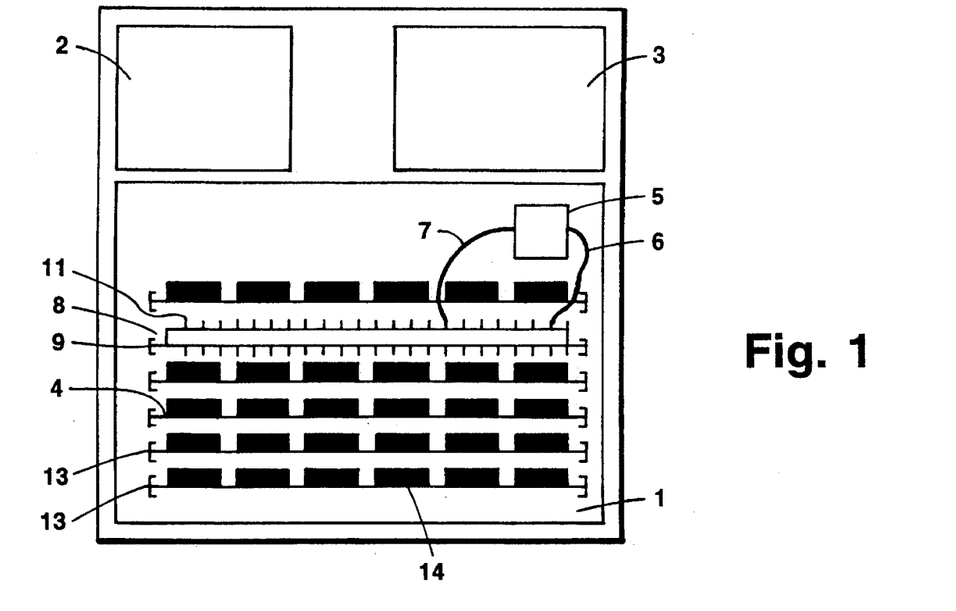
FIG. 1 is a schematic top view of an electrical component system, such as might be used in a personal computer, which system includes a plurality of expansion boards and incorporates one embodiment of the present invention including an evaporator and a condenser.
Figure 2:
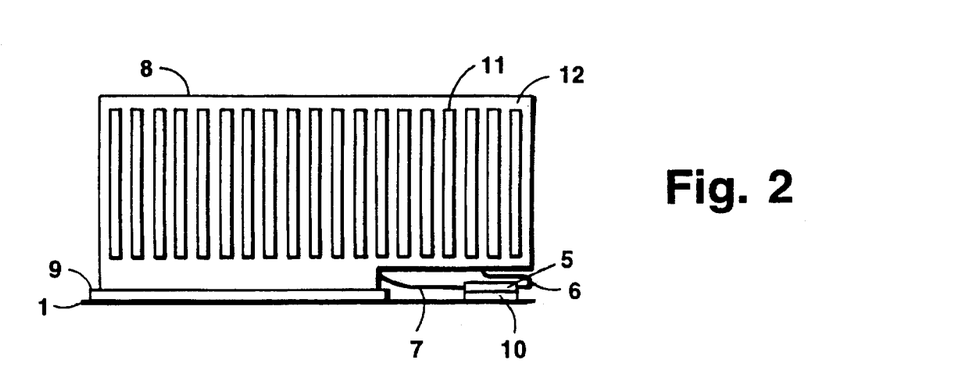
FIG. 2 is a side view of the printed circuit board shown in FIG. 1 with some of the expansion boards removed to show the condenser unit.
Figure 3:
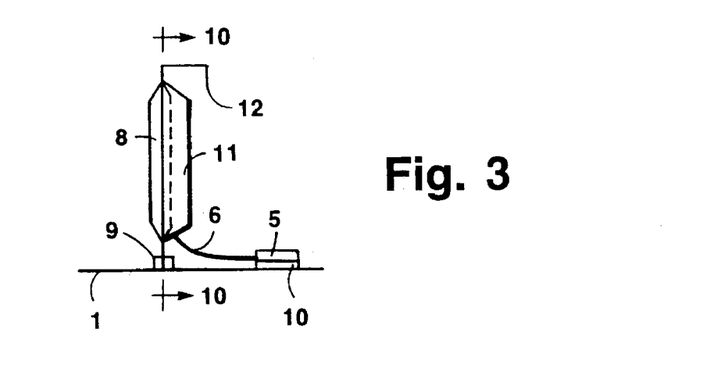
FIG. 3 is a front view of the printed circuit board with some of the expansion boards removed to illustrate the condenser and its fins.

FIG. 1 is a schematic top view of a main printed circuit board or "mother board" of the type that is commonly used in a personal computer system. FIGS. 2 and 3 show the side and front views of mother board 1, respectively. Mother board 1 has a number of components mounted thereon which comprise the personal computer circuitry. A power supply is shown schematically as box 2 and a disc drive is shown schematically as box 3. In addition, mother board 1 would normally be populated with many integrated circuit chips which are not shown in FIG. 1 for clarity. Typically, one or more of such integrated circuit chips would be high-power chips and would be candidates for one or more of the cooling devices of the present invention. Such high-power chips might, for example, comprise the microprocessor of the personal computer system.

In a conventional personal computer system, empty card slots are provided for "expansion cards" which can be inserted by the user to add additional features to the computer. In FIG. 1, a number of expansion card boards 4 are shown inserted into sockets 9 and 13. Each of the boards has a plurality of integrated circuit chips 14 mounted thereon. Boards 4 have been omitted from the side and front views of FIGS. 2 and 3 in order to expose the condenser unit 8 of the present invention. Although several boards 4 are shown inserted into mother board 1 in FIG. 1, it should be understood that, in a typical computer system, there may be no expansion boards inserted in the slots or all of the slots may be filled with expansion boards.

As will hereinafter be explained in detail, in one preferred embodiment of the invention, the condenser unit 8 of the inventive cooling system is designed to fit into an empty expansion card socket 9, thereby fixing the condenser unit 8 in a vertical position which is ideal for coolant drainage and to allow optimum air circulation around fins 11. FIG. 2 shows a side view of the mother board 1 shown in FIG. 1 which illustrates the condenser unit 8 construction in more detail.

As shown in FIG. 2, condenser unit 8 is equipped with fins 11 which increase the surface area and aid in transferring heat between the condenser unit 8 and the surrounding air. Typically, fins 11 are hollow and communicate with the interior of the condenser unit 8 so that the fins also increase the amount of surface area presented to the coolant vapor within the condenser unit 8, thereby increasing the heat transfer from the vapor to the condenser unit 8.

FIG. 3 shows a front view of the mother board 1 with the expansion cards 13 removed illustrating the condenser unit 8. The condenser unit 8 is shown with fins 11 on one side however, fins may be mounted on one or both sides of the condenser unit 8. In addition, hook 12 is formed at the top of the condenser unit 8, which hook allows the condenser unit 8 to be hung from the top of an existing expansion board if no empty expansion slot sockets are available (hook 12 has been omitted from FIG. 1 to illustrate fins 11).

The evaporator unit 5 of the inventive cooling system is illustratively shown mounted on top of a high-power integrated circuit chip 10 which is not visible in FIG. 1, but is shown in FIGS. 2 and 3. Evaporator unit 5 is connected to the condenser unit 8 by means of coolant tubes 6 and 7. Liquid coolant (not shown) in evaporator unit 5 is evaporated by heat dissipated by circuit 10 and the coolant vapor (not shown) is conveyed by vapor tube 6 to condenser unit 8 were the vapor condenses to a liquid and the liquid returns to the evaporator unit 5 via the condensate tube 7 under the influence of gravity.

Figure 4:
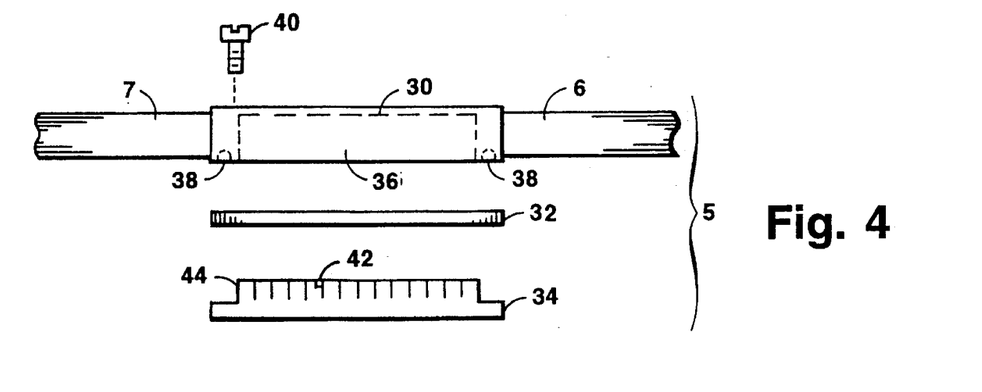
FIG. 4 is an exploded view of the evaporator unit illustrating one manner of assembling the evaporator unit.
Figure 5:
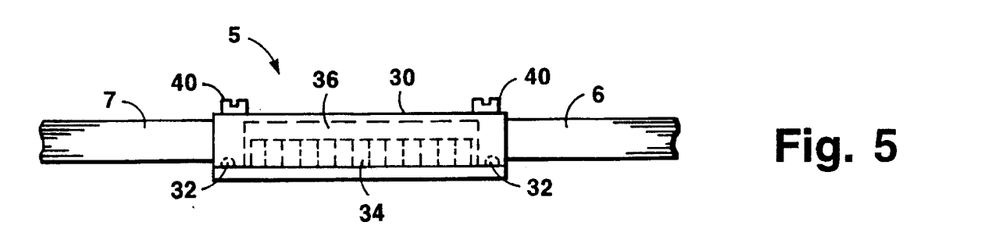
FIG. 5 is an assembled view of the evaporator unit.

FIG. 4 shows an exploded view of the evaporator unit 5. As previously mentioned, the evaporator unit 5 can be either an integral part of the electronic component package or manufactured separately and attached to the package. The construction illustrated in FIG. 4 is designed to be manufactured separately and attached to the component package during, or after, assembly of the printed circuit board 1.

The evaporator unit 5 consists of an evaporator cover 30 which may be made of metal or, preferably, polymeric material. The evaporator cover 30 has a recess 36 which receives a heat spreader plate 34 which conducts the heat generated by the heat dissipating component into the interior of the evaporator unit 5. The heat spreader plate 34 is sealed to the evaporator cover 30 by means of an 0-ring seal 32 which fits into groove 38 in cover 30. In the embodiment shown in FIG. 4, the heat spreader plate 34 and the evaporator cover 30 are fastened together by means of screws 40. Alternatively, it is also possible to attach the heat spreader plate 34 to the evaporator cover 30 by means of epoxy cement, compression seals or other arrangements.

Figure 8:
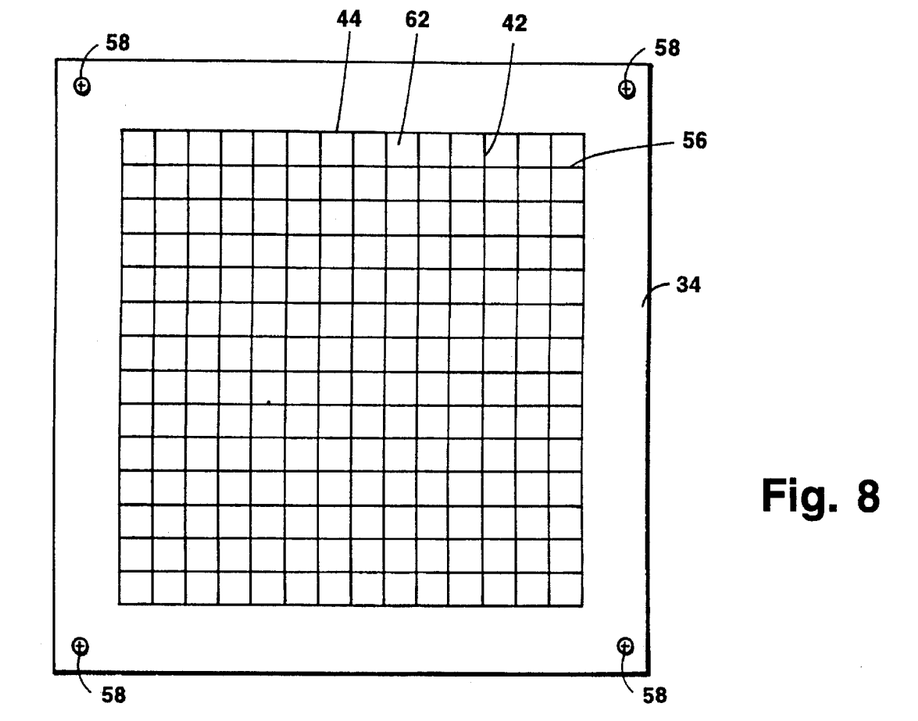
FIG. 8 is a top view of one embodiment of a heat spreader plate showing heat spreading fins formed by grooves cut in the plate.

The heat spreader plate 34 is also shown in more detail in FIG. 8 and can be smooth or flat in cooling systems designed for low-power components, however pin fins or tab fins may be used in high-power designs to help draw the coolant into the hottest areas of the spreader plate. In the design shown in FIGS. 4 and 8, heat spreader plate 34 has a raised portion 44 which fits into the recess 36 of the evaporator cover 30 and raised portion 44 may have slots 42 and 56 cut in it to increase the surface area and to from fins 62 in the plate surface. The heat spreader plate 34 is generally made of a high-conductivity material such as copper, diamond-copper composite, aluminum or, in some cases, high-conductivity plastic materials. The heat spreader plate 34 is provided with four threaded holes, 58, into which screws 40 are threaded to hold plate 34 to the evaporator unit cover 30.

The evaporator unit 5 can be attached to the integrated circuit chip 10 using a variety of conventional techniques. For example, the evaporator unit 5 can be attached to the chip 10 by epoxy cement, soldering, or contact pressure (applied by means of clips or springs). Thermal grease is typically employed to enhance the thermal conductivity between the evaporator unit 5 and the chip 10. It is also possible to make the evaporator cover 30 and the heat spreader plate 34 of porous materials in which case the evaporator unit 5 can be attached to the chip 10 by means of capillary suction forces.

Figure 6:
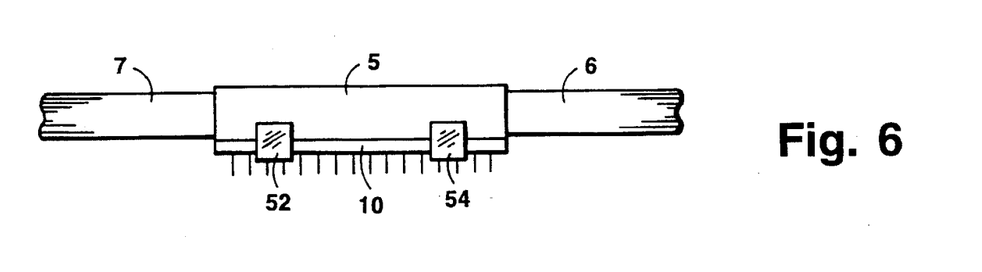
FIG. 6 is a side view of the evaporator unit mounted on the heat dissipating component illustrating the use of clips to hold the evaporator on the component.
Figure 7:
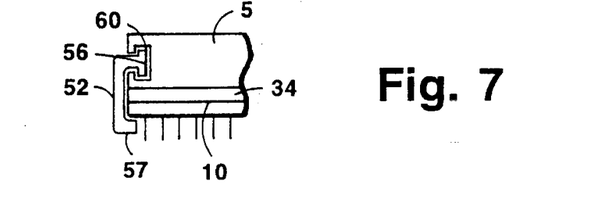
FIG. 7 is a partial sectional view of the evaporator unit illustrating the manner of attaching the clips to the evaporator unit and to the component.

Illustrative C-shaped clips or springs 52 and 54 are shown in FIG. 6 which clips attach the evaporator unit 5 to the chip 10. FIG. 7 shows a partial cross sectional view of the evaporator unit 5 showing a T-shaped channel 60 molded into the wall of the evaporator unit 5. Each C-shaped clip 52 has a T-shaped end 56 which fits into the channel 60 and fastens the clip to the evaporator unit 5. A right angle bend 57 at the lower part of each clip, such as clip 52, slips over the lower edge of chip 10 and holds the evaporator unit 5 firmly to the chip 10.

The evaporator unit 5 and the condenser unit 8 are connected together, via one or more tubes, of which tubes 6 and 7 are shown. Typically, these tubes are flexible and may preferably be made of flexible plastic tubing. Depending on the particular design, limitations on the evaporator unit height may limit the size of the pipes connected to it and it may be necessary to use two or more tubes for either or both of the vapor tubes and the condensate tubes in order obtain the necessary flow cross section. In general, the cross sectional area of the vapor tube 6 will be larger than the cross sectional area of the condensate tube 7 to insure a smooth flow and to insure that pressure does not build tip within the system. But, in those embodiments, described below, that employ frothing action to return condensate to an evaporation area, the cross-sectional area of the vapor tube 6 and condensate tube 7 is preferably equal. It is also possible to use vapor and condensate tubes which are co-extruded or coaxial, but generally, in this latter case, check valves must be used in either or both of the vapor tube 6 and the condensate tube 7 to prevent gases from flowing up or down the condensate tube 7 and to prevent liquid from flowing up or down the vapor tube 6. It is critical that both the vapor and condensate tubes remain open to fluid flow to avoid a pressure increase in the system. If, for example, a liquid blockage develops in a U-shaped section of the vapor tube, the pressure in the evaporator will increase and thereby increase the boiling point of the coolant. Consequently, the vapor and condensate tubes must be arranged such that a free flow of vapor and liquid occurs during the operation of the device.

Figure 9:
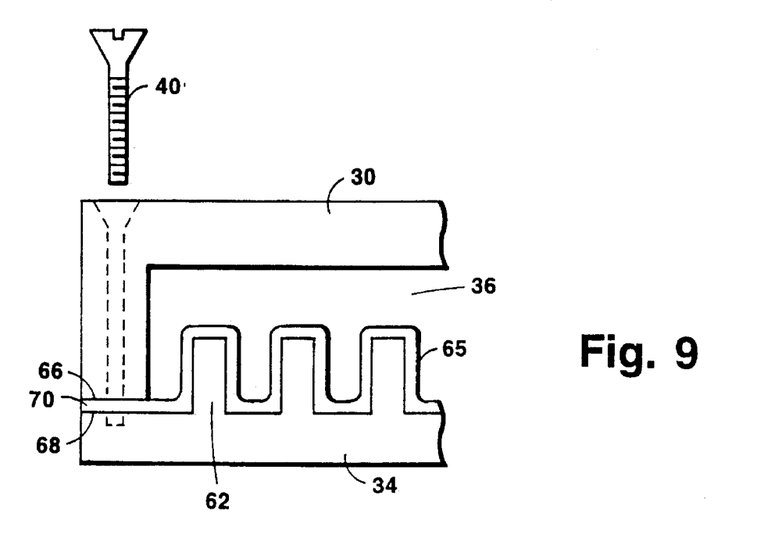
FIG. 9 is a partial cross sectional view of the evaporator unit illustrating an alternative method of assembling the unit.

FIG. 9 shows an alternative method of attaching an evaporator cover 30 comprised of polymeric material to the heat spreader plate 34. In particular, prior to assembly of the evaporator unit 5, the heat spreader plate 34 is coated with a vacuum-formed layer of polymeric material 65. Layer 65 allows the polymeric evaporator cover to be solvent welded to the polymeric layer 65. In particular, during assembly, a suitable solvent is applied to the lower edge 66 of evaporator cover 30 which then bonds to the upper surface 70 of plastic layer 65 to the lower edge 66 of the evaporator cover 30. Additional screws 40 can be provided to increase the mechanical integrity of the structure.

Figure 10:
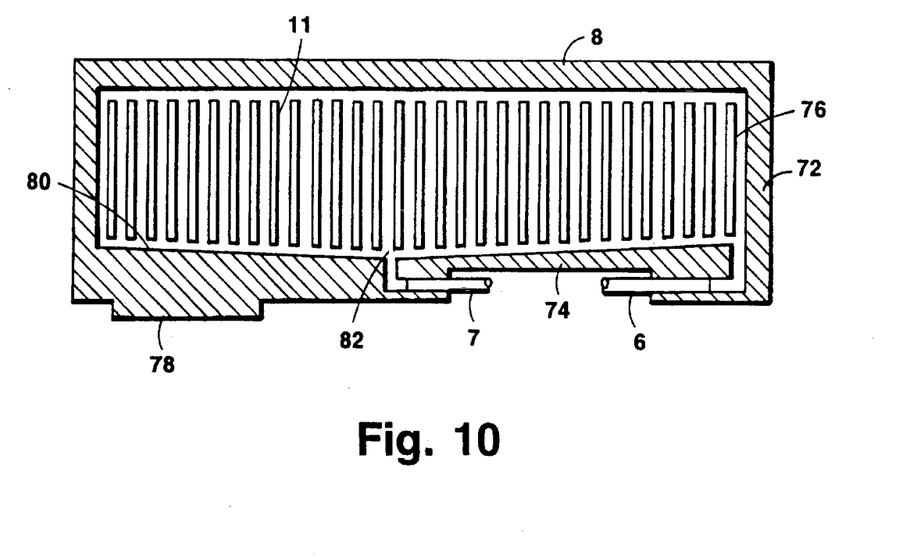
FIG. 10 is a schematic cross sectional plan view of the condenser unit taken along the section lines 10—10 in FIG. 3.

FIG. 10 shows an illustrative construction of the condenser unit 8 of the present invention. The condenser unit 8 is preferably constructed of polymeric material which is heat-sealed at locations 74 and 72 and shaped such that the condensate returns to the condensate line 7 under the influence of gravity. Condensate return is accomplished by making the bottom edge 80 of the condenser unit 8 slanted so that a "sump" area 82 is formed directly over the condensate tube 7.

A baffle 76 may be added to the condenser unit 8 so that vapor entering the condenser unit 8 from the vapor tube 6 passes directly upwards to the upper portion of the condenser unit 8 and does not mingle with the condensed liquid on entry to the condenser. The condenser unit 8 shown in FIG. 10 is provided with a tab 78 which can fit into an expansion slot socket on the mother board 1 as shown in FIGS. 1–3.

Figure 11A:
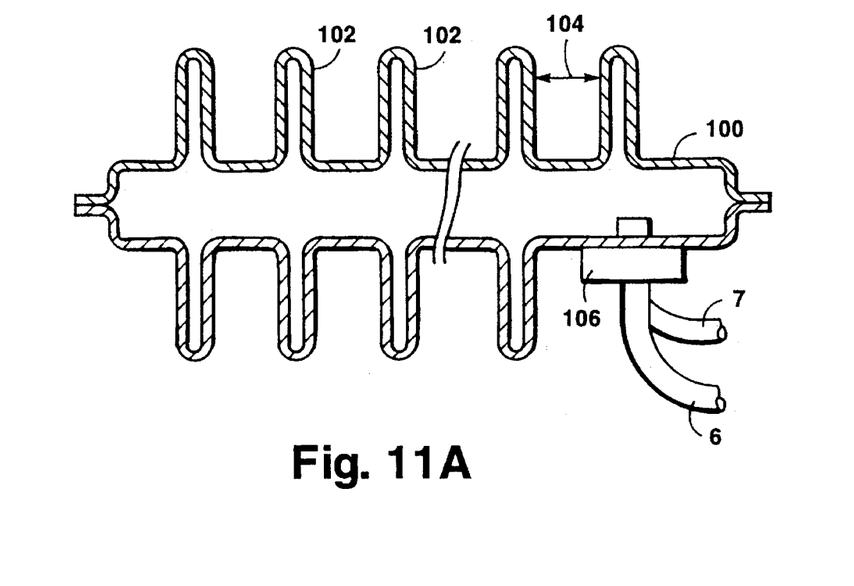
FIG. 11A is a partial cross sectional view of an embodiment of the condenser unit which is entirely comprised of flexible walls.

As previously mentioned, condenser unit 8 can be made of either thick or thin materials and can be injection-molded or blow-molded. Alternatively, where small size is desired, thin sheet materials can be used since there is a smaller thermal gradient across the material. FIG. 11A illustrates a partial cross section of an embodiment of the condenser unit 8 which is entirely comprised of flexible sheets of polymeric material. The polymeric material 100, which may, for example, be polypropylene, can be vacuum formed over a rigid mandrel (not shown) to form the fins 102. The distance 104 between the fins is selected in accordance with conventional convection theory to maximize heat transfer between the condenser unit and the surrounding environment. The width of the fins themselves is minimized in order to increase the heat transfer from the vapor in the condenser to the condenser walls. The vapor tube 6 mad the condensate tube 7 can be attached to the sheet material 100 by cementing the tubes or by suitable fittings 106.

Figure 11B:
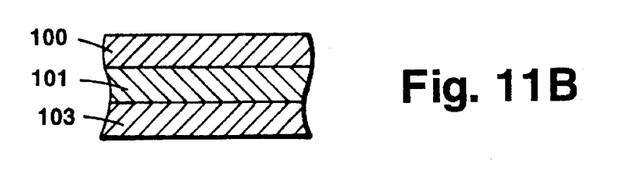
FIG. 11B is a partial cross section through a multi-layer flexible sheet as might be used in the flexible walls.

Although only a single sheet (100) of flexible material is shown in FIG. 11A, the polymeric sheets may be multi-layered to limit gas permeability. For example, as shown in FIG. 11B, the polypropylene sheets illustrated in FIG. 11A may consist of a polypropylene sheet 100 covered on one side by a layer of vapor-deposited aluminum 101. The vapor deposited aluminum 101 may, in turn, be covered by a layer of polycarbonate or KAPTON® 103 to protect it.

Figure 12:
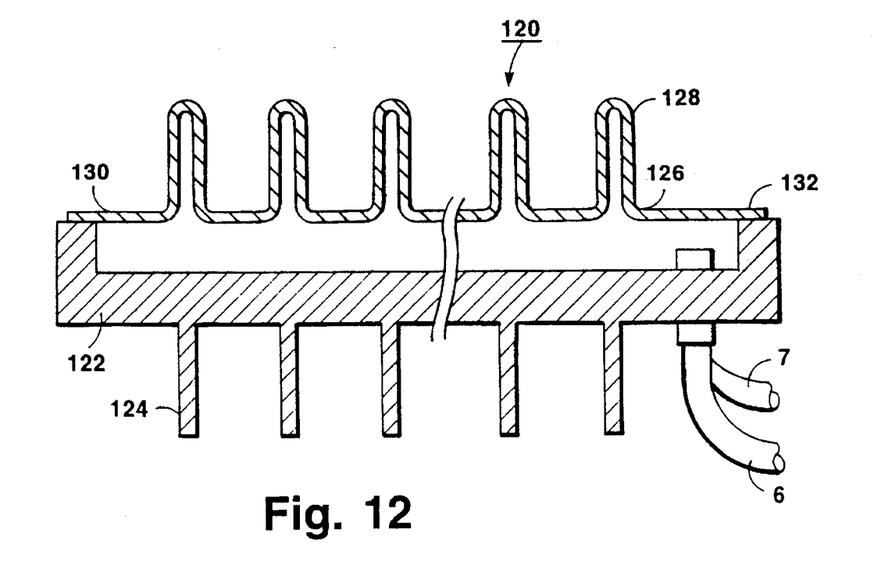
FIG. 12 is a partial cross sectional view of an embodiment of the condenser unit which is comprised partially of rigid walls and partially of flexible walls.

It is also possible to form at least one wall of the condenser unit 8 of a thin gauge metal, for example aluminum, which metal can also be formed with fins for enhanced heat transfer. A thin flexible sheet can then be sealed to the metal wall to provide the flexible wall necessary for zero differential pressure operation. FIG. 12 illustrates a partial cross section of a further embodiment of the condenser unit which is partially comprised of a rigid material and partially comprised of a flexible sheet. The rigid part 122 of the condenser unit 120 may be comprised of a polymeric material such as polypropylene or may be comprised of a metal such as aluminum. Fins 124 may be molded into the rigid material as shown in FIG. 12 or the rigid condenser section may consist of a smooth plate. The flexible portion 126 of the condenser may be comprised of a sheet of polymeric material such as polypropylene, and may also have fins 128 molded into it. The flexible portion 126 is heat-sealed to the rigid portion 122 in the areas 130 and 132 to form a sealed unit. In the case of a two part condenser the vapor and condensate tubes, 6 and 7, are preferably connected to the rigid portion as shown in FIG. 12.

Figure 13:
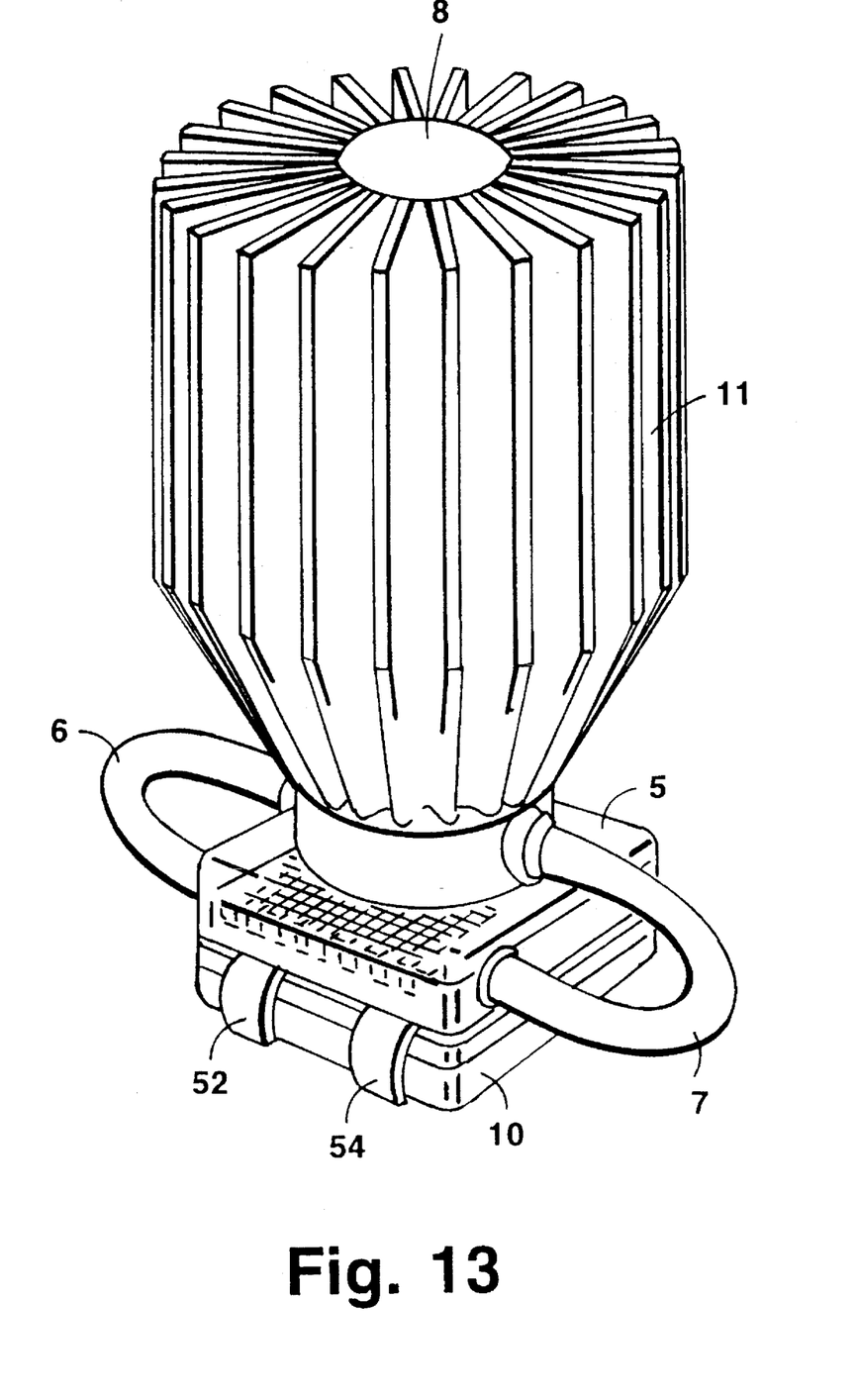
FIG. 13 is a perspective view illustrating an embodiment in which a condenser unit 8 with a circular cross section is mounted on top of the evaporator unit.

Condenser unit 8 may also have spatial configurations different from that shown in FIG. 10. For example, condenser unit 8 may be circular, or square in cross section. The condenser unit 8 can also be located in almost any expansion slot location as shown in FIGS. 1–3. In lap-top, portable notebook and sub notebook size computers, the condenser unit 8 may be located on the backside of a flip-up display screen typically found in such computers. A "chimney" enclosure can also be used to increase efficiency. Other locations for the condenser unit 8 include the inlet or outlet of the power supply box 2. In designs where vertical height is not a problem above the chip 10 that is to be cooled, it is also possible to mount the condenser unit 8 on top of the evaporator unit 5. Such a configuration is shown in FIG. 13 which illustrates a condenser with a circular cross section. In cases where space permits the condenser unit 8 to be mounted on top of the evaporator unit 5, the condenser unit 8 can also be made integral with the evaporator unit 5 thereby eliminating the need for the vapor and condensate tubes 6 and 7.

Figure 14:
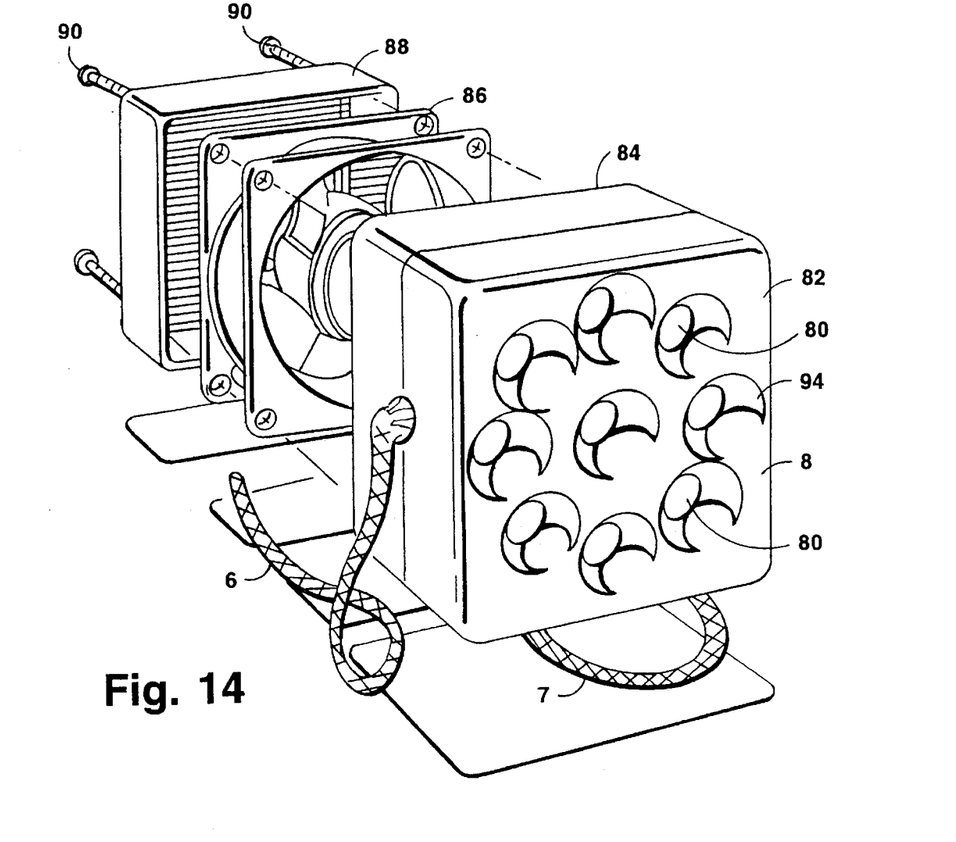
FIG. 14 is a perspective exploded view illustrating an embodiment in which a condenser unit 8 utilizes forced air flow.
Figure 15:
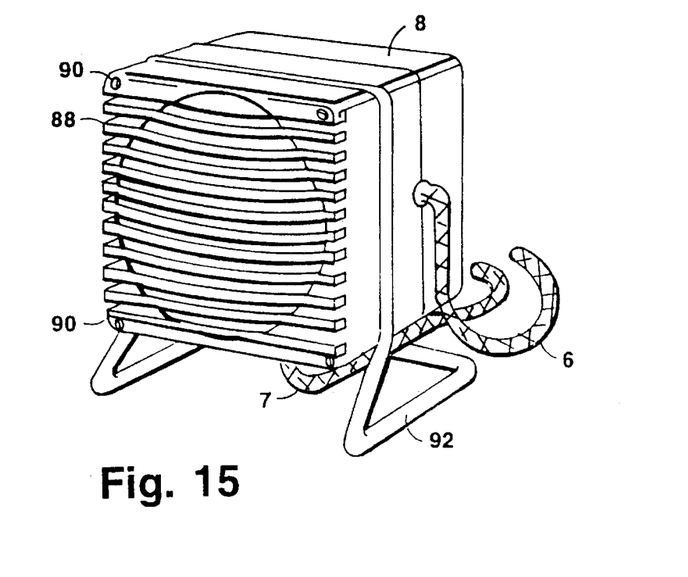
FIG. 15 is a perspective view illustrating the embodiment shown in FIG. 14 in assembled form.

In addition, it is possible to use cooling system configurations in which the airflow over condenser unit 8 is forced by a fan. FIGS. 14 and 15 show an exploded and assembled view of such an illustrative configuration, respectively. The condenser unit 8 in this embodiment comprises a unit with a substantially rectangular cross section. The condenser unit 8 has a number of through holes 80 which pass from side 82 to side 84. A conventional electric fan 86 is mounted on one side 84 of the condenser unit 8 by means of screws 90. The fan is covered by a cover 88. The unit can be mounted on a stand 92. The condenser unit 8 can be fabricated by injection or blow molding the unit 8 in two halves and selling the halves together by cementing, heat sealing or ultrasonic welding. Venturi entrances 94 are located around each of the holes 80 to facilitate molding of the polymeric parts and to reduce pressure drop.

Figure 16:
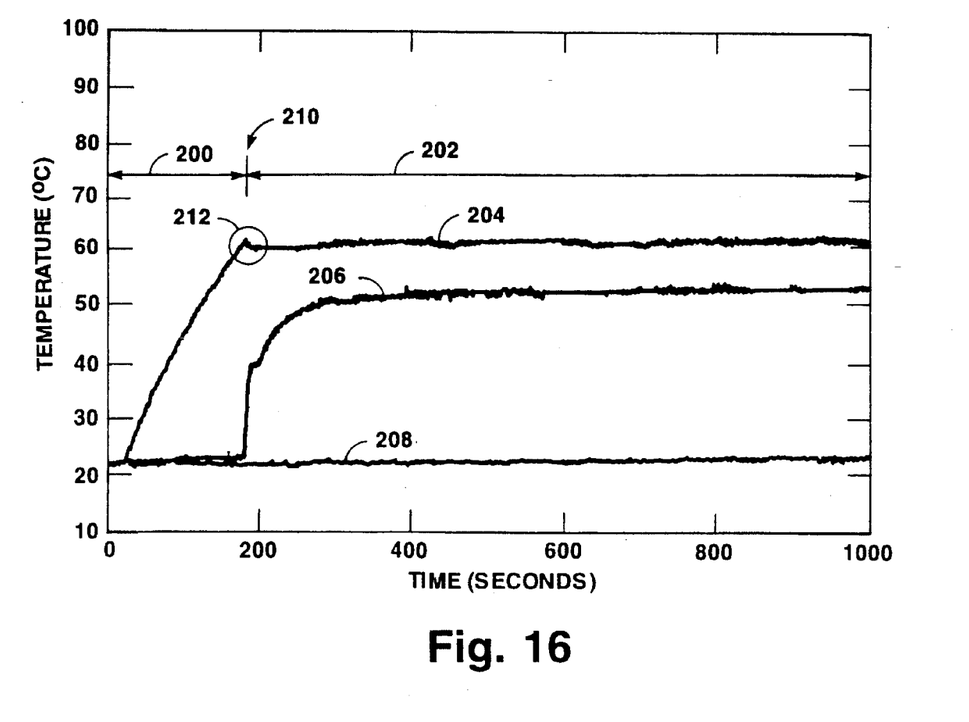
FIG. 16 is a plot of temperature versus time of the temperature of a heat dissipating component which is cooled with one embodiment of the present invention.

However, as previously mentioned, because the condensate returns to the evaporator unit 5 by gravity, in all gravity-return embodiments, the condenser unit 8 must be located above the evaporator unit 5 and there must be no portion of either the vapor tubing 6 or the condensate tubing 7 that dips below the height of the evaporator unit so that no air pockets are formed in the tubing connecting the evaporator unit 5 and the condenser unit 8. However, other embodiments can use conventional pumps or wicking mechanisms to return the condensate to the evaporator unit 5. In these cases it is not necessary for the condenser unit 8 to be above the evaporator unit As illustrated in FIG. 16, the thermal response of the condenser 206 lags behind the thermal response of the evaporator 204. The amount of the lag is indicated as reference number 200.

One embodiment of the invention, illustrated in FIGS. 17A, 17B through 20, accommodates the situation where the condenser unit 8 may not be located "above" the evaporator unit 5 and, consequently, condensate may not be returned from the condenser unit 8 to the evaporator unit 5 solely by operation of gravity. Such a situation may occur, for example, when the cooling system operates in a computer positioned "on its side" (the motherboard 1 is perpendicular to an office floor) during operation. Alternatively, the cooling system may operate in a portable or notebook computer that operates in a wide variety of orientations that place the evaporator unit 5 on the same level as, or above, the condenser unit 8 during operation.

In the embodiment of the invention illustrated in FIGS. 17A, 17B through FIG. 20, condensate is returned from the condenser unit 8 to the evaporator unit 5 by a coolant "frothing" action induced by a small electric heater. Thus, in this embodiment, the two-phase cooler may accommodate an application that requires greater condensate delivery than a wick can provide, in an orientation that precludes gravity-return, while avoiding the expense and complexity of a mechanical pump with moving parts.

Figures 17A, 17B:
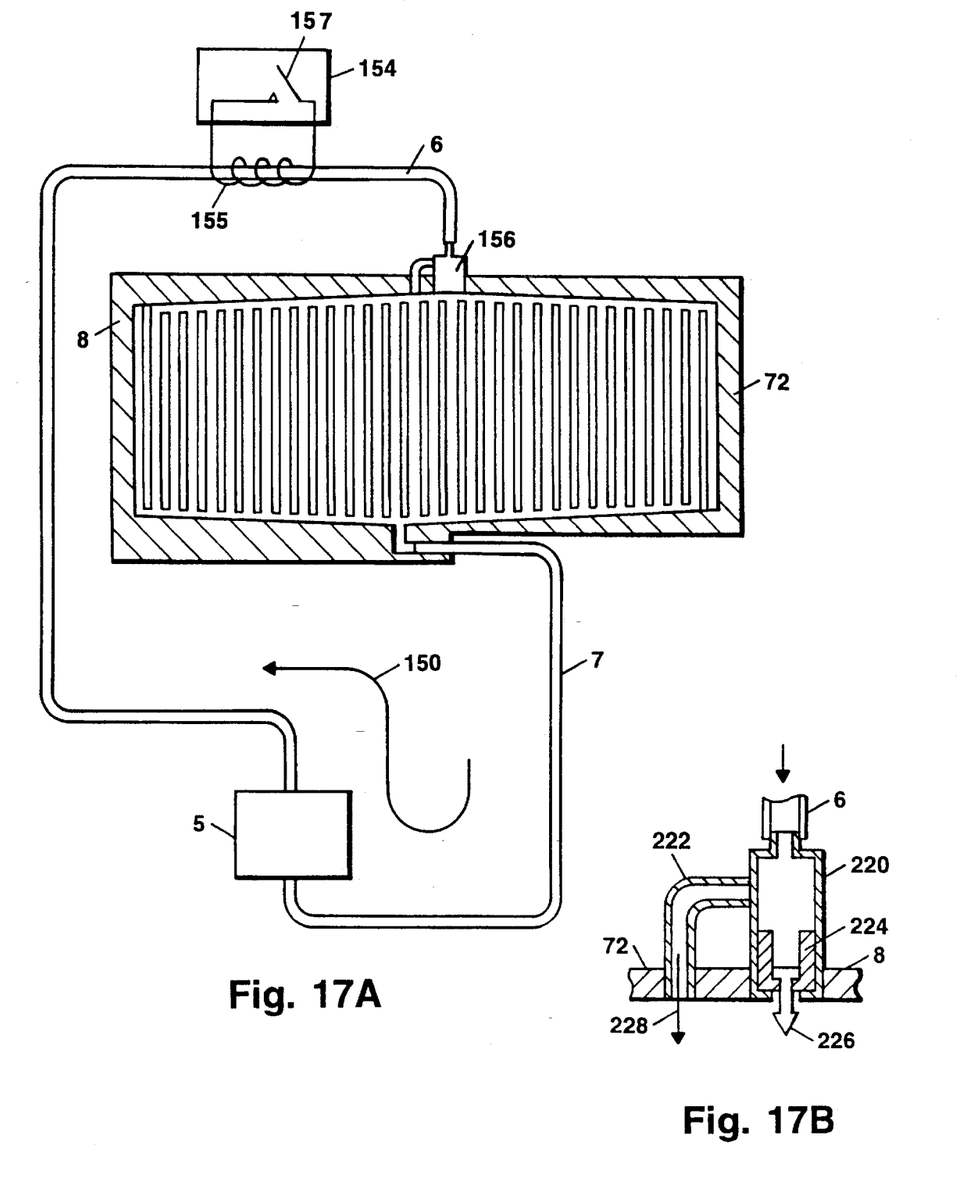
FIG. 17A is a partial cross sectional plan view of the condenser unit and coolant tubes in combination with a side view of the evaporator unit, a check valve and heater coil of one embodiment of the invention which can operate in several positions.
FIG. 17B is a partial cross sectional enlarged view of the bypass valve used in the embodiment of FIG. 17A illustrating the position of the internal parts.
Figure 18A:
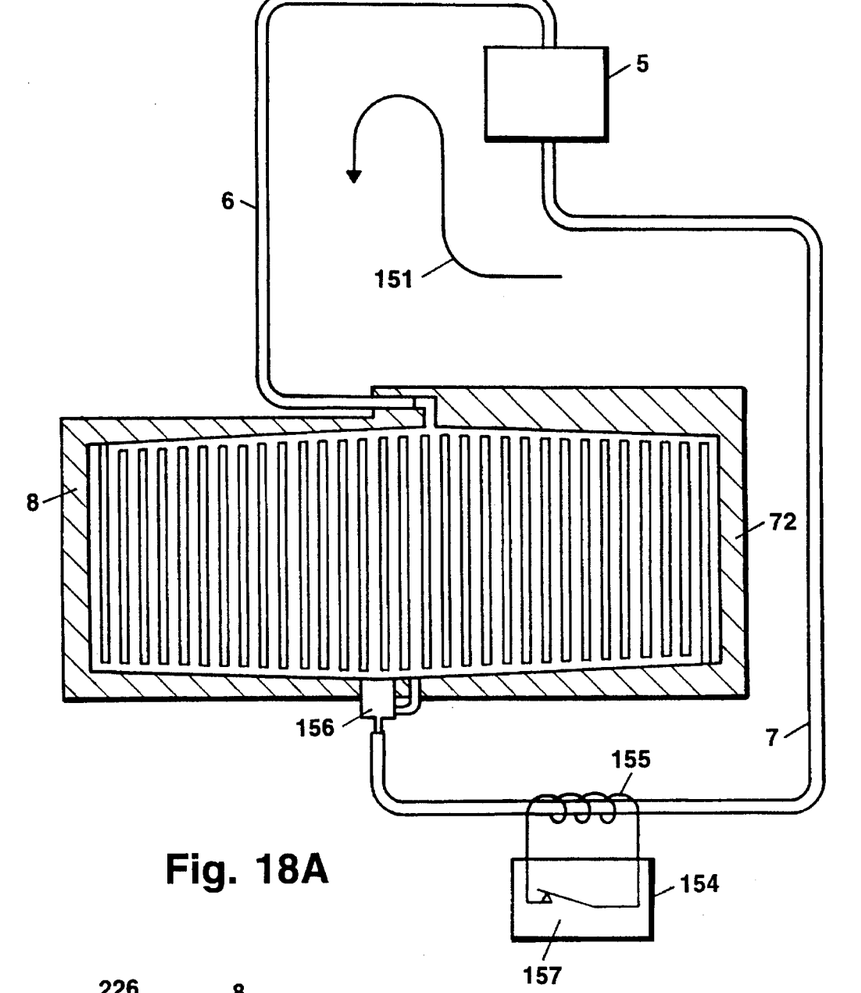
FIG. 18A is a partial cross sectional plan view of the embodiment shown in FIG. 17A operating in an orientation inverted from the FIG. 17A orientation.
Figure 20:
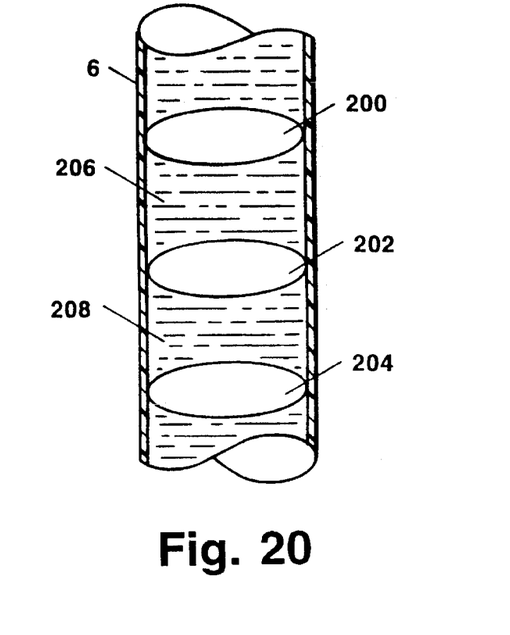
FIG. 20 is a cross-sectional diagram of a vapor/condensate line illustrating the pumping action of rising vapor bubbles.

More specifically, the embodiment shown in FIG. 17A is capable of operating in several orientations, including the upright or "normal" orientation illustrated in FIG. 17A and an "inverted" orientation illustrated in FIG. 18A. In the orientation illustrated in FIG. 17A, evaporator unit 5, condenser unit 8, condensate tube 7, and vapor tube 6 all operate as previously described so that coolant returns from the condenser 8 to the evaporator 5 under the influence of gravity. More specifically, in such a system, the coolant enters its vapor phase in evaporator unit 5 and the vapor travels up the vapor tubing 6. In general, when traveling up tubing 6, the vapor forms discrete bubbles which trap pockets of liquid between the bubbles so that spurts of liquid travel up vapor tubing 6 and enter the condenser unit 8. Such a situation is illustrated in FIG. 20 which illustrates a cross sectional diagram of tubing 6. Discrete bubbles 200,202 and 204 travel up tubing 6 trapping liquid pockets 206 and 208 between them.

In the condenser 8 the vapor transported in the bubbles condenses back to the liquid phase. Gravity pulls the liquid-phase condensed coolant and the coolant carried up the vapor line by the bubbles from the condenser 8 back into the evaporator unit 5 via the condensate tubing 7. The direction of the coolant flow is essentially in the direction o/ arrow 150.

In order to allow the cooling system to operate in various orientations, a gravity-controlled heater unit 154 and a bypass valve 156 are provided. The heater coil 155 is preferably activated by a gravity-activated switch 157. Such a switch 157 may be, for example, a mercury switch such as those commonly found in household thermostats, but the details of the switch operation are not material to this disclosure. The switch 157 is arranged to couple electric current into the coil 155 in cooling system orientations where a gravity-assisted return of the condensate to the evaporator 5 will not occur. In orientations where gravity will operate on the condensate, the heater coil 155 is shut of 12 Accordingly, as shown in FIG. 17A, the heater coil 155 does not operate.

The function of the bypass valve 156 is to control the coolant flow direction as will hereinafter be described. The internal construction of the valve is shown in detail in the longitudinal cross sectional diagram of FIG. 17B. As shown in FIG. 17B, the valve comprises a valve body 220 which may be, but does not have to be, cylindrical in cross section. The valve body has an opening in the side to which a bypass tube 222 is connected. The bypass tube 222 also passes tough the wall 72 of condenser 8. Also contained in the valve body 220 is a relatively heavy slider 224 whose function is to shut off the bypass tube 222 when the cooling system is operating in an "inverted" orientation (as will hereinafter be explained). The slider 224 has a hole in the bottom which can selectively be closed by check valve 226.

Figure 19:
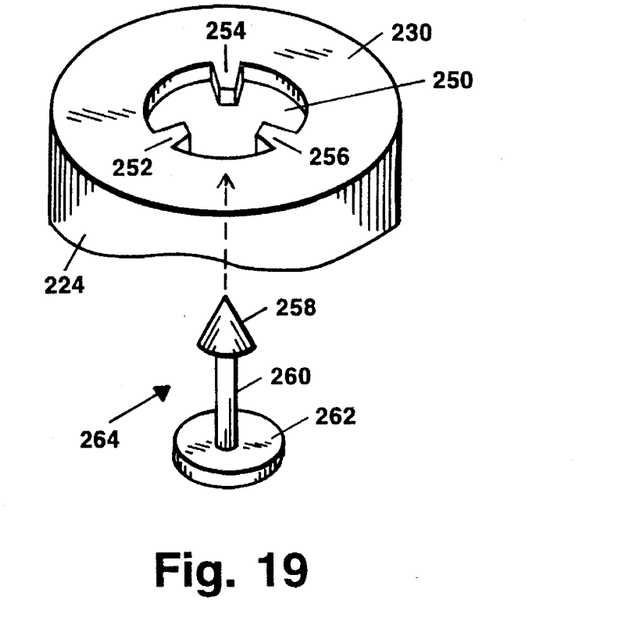
FIG. 19 is a partial perspective view of the one-way check valve used in the bypass valve illustrated in FIGS. 17B and 18B.

A more detailed illustration of the construction of the check valve is shown in FIG. 19. In particular, the bottom 230 of the slider 224 has a hole 250 that, in turn, has a plurality of projecting fingers 252,254 and 256. Three fingers are shown, but other numbers of fingers could also be used. The valve body 264 comprises a head portion 258, a body 260 and a flat valve part 262 and is preferably fabricated from an elastomeric material. The fingers 252, 254 and 256 protrude sufficiently far into the hole 250 that the head portion 258 of the valve body 264 can be forced through the fingers 252,254 and 256 to retain the valve body 264 in the hole 250. When slider body 224 is positioned as shown in FIG. 19, the valve body 264 drops down so that the head portion 258 rests against the fingers 252, 254 and 256. There is sufficient space between the fingers 252, 254 and 256 so that fluid can flow around the head portion 258 into the slider 224.

However, when the slider is inverted, the valve body 264 drops down so that the flat part 62 covers the hole 250. The flat part 262 has a sufficient diameter that the entire hole 250 is covered and, thus, fluid flow is prevented.

FIG. 18A illustrates an "inverted" orientation where gravity does not return the coolant to the evaporator. In this orientation, gravity would normally drain all of the coolant out of the evaporator unit 5 into the condenser unit 8. The lack of coolant in the evaporator unit 5 would prevent the operation of the cooling system and could lead to catastrophic failure of the heat dissipating device which is cooled by the system.

However, in the orientation illustrated in FIG. 18A, the heater switch 157 in the heater unit 154 activates the heater coil 155. Since the heater unit 154 is located at the "lowest" point of the system in the orientation shown in FIG. 18A, there will always be liquid coolant at this point. Sufficient heat is generated by coil 155 to vaporize some of this liquid coolant. As previously mentioned, bubbles form in the tubing 7 as shown in FIG. 20 and this frothing action effectively pumps fluid up the tubing line 7 into the evaporator unit 5 so that the cooling system is enabled to operate.

If the coolant bubbles produced by coil 155 were permitted to move freely in any direction, some of the bubbles would inevitably move back towards the condenser unit 8. In turn, coolant would be transported between the bubbles back into the condenser unit 8 from that portion of the vapor tube encircled by the coil 155, instead of into the evaporator 5. The invention therefore preferably employs the bypass valve 156 to prevent the flow of coolant vapor bubbles (and liquid coolant trapped between the bubbles) from the vapor tube 7 into the condenser 8 when the system is in the orientation illustrated in FIG. 18A.

Figure 18B:
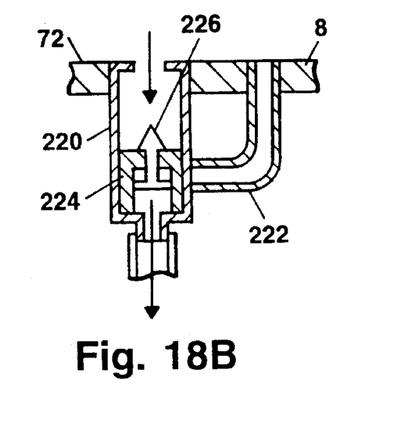
FIG. 18B is a partial cross sectional enlarged view of the check valve illustrating the position of the internal parts when the embodiment is operating in the orientation illustrated in FIG. 18A.

The positions of the internal parts of the bypass valve in this latter orientation are illustrated in FIG. 18B. In this orientation, the slider 224 moves down so that it blocks the bypass tube 222. In addition, the check valve 226 drops down so that it allows fluid in the condenser unit to flow out of the condenser into tubing 7. However, since the check valve 226 is relatively light, if a coolant vapor bubble attempts to enter the condenser unit 8 from tubing 7, the bubble presses against the flat part 262 of the check valve 226 pushing the flat part into a closed position up against the hole 250 of the slider 224 and blocking the bubble from entering the condenser 8. The check valve 226 will remain in the closed position until sufficient fluid collects in the condenser to force the valve 226 down and allow the fluid to escape.

Consequently, the coolant vapor bubbles cannot flow into the condenser 8 and will eventually rise up the tubing 5, thereby carrying fluid into the evaporator unit 5 as previously described. The fluid flow is thus established in the direction of arrow 151.

In other embodiments check valve 156 may be, for example, a "dual" check valve which comprises two valves, one of which operates when gravity-return is effective, the other operates when gravity-return is not effective. The dual valve ensures that, in the generally upright orientation, condensate flows in the normal direction and, when not so oriented, condensate flows in the opposite direction.

In any case, at least one flexible wall is provided in the system which allows the system to change in volume in order to maintain the internal system pressure substantially equal to the ambient pressure. Although the flexible walls have been located in the condenser in the embodiments discussed above, the flexible walls may be located in any other part of the system including the evaporator. Alternatively, either or both of the vapor and condensate conduits may be made sufficiently flexible to allow the system to operate with a zero pressure differential.

The cooling system is partially filled with a liquid coolant during operation. A variety of coolants can be used based on several factors including, but not limited to, boiling or evaporation temperature (which should be between 55° C. and 80° C.), chemical compatibility with the components of the evaporator unit 5 and the condenser unit 8, chemical stability, toxicity and cost. Coolants which are suitable for use with the invention include ethyl alcohol, methanol and fluorochemicals, such as FLUORINERT® manufactured by the Minnesota Mining and Manufacturing Company located in St. Paul Minn.

Contrary to prior art heat pipe designs, the present cooling system is not purged of residual gas during construction. Instead coolant is added to the system and the system is sealed including residual gas such that the internal pressure of the cooling system at ambient room temperature is the same as the ambient environment pressure (typically one atmosphere). As heat dissipated by the heat-generating integrated circuit causes the coolant to approach boiling, some of the residual gas dissolved in the coolant comes out of solution and activates nucleation sites which initiate boiling substantially at the normal boiling point of the coolant material.

Additional nucleation sites may be provided in the evaporator unit 5 by specially treating the inner surface of the evaporator unit 5, for example by laser machining the heat spreader plate and/or the interior of the evaporator cover 30 to provide a pitted surface. If the pits are of suitable shape and size, they will provide nucleation sites which ensure that the coolant boils substantially at its boiling point. The provision of suitable nucleation sites eliminates the overshoot phenomenon which is typically found in prior art devices.

Alternatively, the heat spreader plate 34 or the evaporator unit cover 30, or portions thereof, can be fabricated of sintered metal. It has been found that if the sintered metal parts are compacted to 60%–70% of their normal compacted density to produce an average pore size on the order of 100 microns, that the sintered metal pans will produce sufficient nucleation sites to initiate boiling.

Due to the fact that nucleation sites have been provided in the evaporator 5, the temperature versus time curve of a typical heat-generating component using the cooling system of the present invention is shown in FIG. 16. In FIG. 16, line 204 represents the temperature of evaporator 5 versus time, line 206 represents the surface temperature of condenser unit 8 versus time and line 208 represents the ambient environmental temperature versus time. As can be seen tom the FIG., the initial temperature of the evaporator unit 5 steadily rises as all of the cooling system units heat up (the time period illustrated as 200 in FIG. 17). However, once the coolant boiling point temperature is reached at approximately point 210, the evaporator unit 5 temperature stabilizes and remains relatively constant over the time period 202. There is very little overshoot in the area 212 when the coolant boiling temperature is reached.

The foregoing description has been limited to specific embodiments of this invention. It will be apparent, however, that variations and modifications may be made to the disclosed embodiments of the invention, with the attainment of some or all of its advantages. For example, it will be obvious to those skilled in the art that the present invention can be used with components other than the specific electronic components disclosed. An example of a potential use is to cool the motor of an electric automobile. In addition, although the heater coil in the illustrative embodiment is shown disposed on the fluid tubing outside of the condenser unit, the heater and bypass valve could be included as pan of the condenser unit, itself. Therefore, it is the object of the appended claims to cover all such variations and modifications as come within the true spirit and scope of the invention.

What is claimed is:

1. Apparatus for cooling a heat dissipating component, the apparatus being capable of operating in a first orientation and in a second orientation, the apparatus comprising:

an evaporator unit having a first thermally conductive wall in thermal contact with the heat dissipating component;

a condenser unit located vertically above the evaporator unit in the first orientation and vertically below the evaporator unit in the second orientation;

a first conduit connecting the evaporator unit and the condenser unit;

a second conduit connecting the condenser unit to the evaporator unit to form a hermetic enclosure with an interior;

a liquid coolant disposed within the hermetic enclosure interior, the liquid coolant having a sufficiently low boiling point that the liquid coolant is changed to a vapor by the heat dissipated from the heat dissipating component; and a heater operative only in the second orientation for heating a portion of the hermetic enclosure sufficiently to cause bubbles of coolant vapor to form and rise in the first conduit.

2. Cooling apparatus according to claim 1 wherein the heater heats the liquid coolant in a portion of the condenser to cause bubbles of coolant vapor to form and rise in the first conduit.

3. Cooling apparatus according to claim 1 wherein the heater heats the liquid coolant in a portion of the first conduit to cause bubbles of coolant vapor to from and rise in the first conduit.

4. Cooling apparatus according to claim 1 further comprising a check valve responsive to the coolant vapor bubbles for forcing the coolant vapor bubbles to move in the first conduit in a predetermined direction.

5. Cooling apparatus according to claim 4 wherein, when the cooling apparatus is operating in the second orientation, the check valve is responsive to liquid coolant for allowing the liquid coolant to move in a direction opposite to the predetermined direction.

6. Cooling apparatus according to claim 4 wherein, when the cooling apparatus is operating in the first orientation, the check valve is responsive to liquid coolant for allowing the liquid coolant to move in the predetermined direction.

7. Cooling apparatus according to claim 4 wherein, when the cooling apparatus is operating in the first orientation, the check valve is responsive to coolant vapor for allowing the coolant vapor to move in the predetermined direction.

8. Cooling apparatus according to claim 1 wherein the heater is responsive to the force of gravity for heating a portion of the hermetic enclosure.

9. Cooling apparatus according to claim 8 wherein the heater comprises an electrical heating coil and a gravity-operated switch.

10. Apparatus for cooling a heat dissipating component, the apparatus being capable of operating in a first orientation and in a second orientation in an environment with an ambient pressure over a temperature range, the apparatus comprising:

an evaporator unit having a first thermally conductive wall in thermal contact with the heat dissipating component;

a condenser unit located vertically above the evaporator unit in the first orientation and vertically below the evaporator unit in the second orientation;

a first conduit connecting the evaporator unit and the condenser unit;

a second conduit connecting the condenser unit to the evaporator unit to form a hermetic enclosure with an interior and an internal pressure, the hermetic enclosure having at least one wall which is sufficiently flexible that the internal pressure remains substantially at the ambient pressure over the entire temperature range;

a liquid coolant disposed within tile hermetic enclosure interior, the liquid coolant having a sufficiently low boiling point that the liquid coolant is changed to a vapor by the heat dissipated from the component; and a heater operative only in the second orientation for heating a portion of the hermetic enclosure sufficiently to cause bubbles of coolant vapor to form and rise in the first conduit.

11. Cooling apparatus according to claim 10 wherein the heater heats a portion of the condenser to cause bubbles of coolant vapor to form and rise in the first conduit.

12. Cooling apparatus according to claim 10 wherein the heater heats a portion of the first conduit to cause bubbles of coolant vapor to form and rise in the first conduit.

13. Cooling apparatus according to claim 10 further comprising a check valve responsive to the coolant vapor bubbles for forcing the coolant vapor bubbles to move in the first conduit in a predetermined direction.

14. Cooling apparatus according to claim 13 wherein, when the cooling apparatus is operating in the second orientation, the check valve is responsive to liquid coolant for allowing the liquid coolant to move in a direction opposite to the predetermined direction.

15. Cooling apparatus according to claim 13 wherein, when the cooling apparatus is operating in the first orientation, the check valve is responsive to liquid coolant for allowing the liquid coolant to move in the predetermined direction.

16. Cooling apparatus according to claim 13 wherein the check valve comprises a bypass tube, and when the cooling apparatus is operating in the first orientation, the check valve is responsive to coolant vapor for allowing the coolant vapor to enter the condenser unit by means of the bypass tube.

17. Cooling apparatus according to claim 10 wherein the heater comprises an electrical heating coil and a gravity-operated switch.

18. Computer apparatus capable of operating in a first orientation and in a second orientation in an environment with an ambient pressure over a temperature range, the apparatus comprising:

a heat dissipating microprocessor;

a memory unit;

an evaporator unit having a first thermally conductive wall in contact with the microprocessor;

a condenser unit located vertically above the evaporator unit in the first orientation and vertically below the evaporator unit in the second orientation;

a first conduit connecting the evaporator unit and the condenser unit;

a second conduit connecting the condenser unit to the evaporator unit to form a hermetic enclosure with an interior and an internal pressure, the condenser unit having at least one wall which is sufficiently flexible that the internal pressure remains substantially at the ambient pressure over the entire temperature range;

a liquid coolant disposed within the hermetic enclosure interior, the liquid coolant having a sufficiently low boiling point that the liquid coolant is changed to a vapor by the heat dissipated from the microprocessor; and a heater operative only in the second orientation for heating a portion of the first conduit sufficiently to cause bubbles of coolant vapor to form and rise in the first conduit.

19. Computer apparatus according to claim 18 further comprising a check valve responsive to the coolant vapor bubbles for preventing the coolant vapor bubbles from entering the condenser unit from the first conduit when the computer apparatus is operating in the second orientation.

20. Cooling apparatus according to claim 19 wherein the check valve comprises a bypass tube, and when the cooling apparatus is operating in the first orientation, the check valve is responsive to coolant vapor for allowing the coolant vapor to enter the condenser unit by means of the bypass tube.

* * * * *